United States Patent
Sato et al.

(10) Patent No.: US 7,118,834 B2
(45) Date of Patent: Oct. 10, 2006

(54) EXPOSURE METHOD, EXPOSURE QUANTITY CALCULATING SYSTEM USING THE EXPOSURE METHOD AND SEMICONDUCTOR DEVICE MANUFACTURING METHOD USING THE EXPOSURE METHOD

(75) Inventors: Takashi Sato, Fujisawa (JP); Shoji Mimotogi, Yokohama (JP); Shigeru Hasebe, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 124 days.

(21) Appl. No.: 10/814,303

(22) Filed: Apr. 1, 2004

(65) Prior Publication Data
US 2004/0253553 A1 Dec. 16, 2004

(30) Foreign Application Priority Data
Apr. 4, 2003 (JP) ............................. 2003-101063

(51) Int. Cl.
*G01F 9/00* (2006.01)
*G03C 5/00* (2006.01)

(52) U.S. Cl. ............................. 430/5; 430/30; 430/394
(58) Field of Classification Search .................... 430/5, 430/30, 311, 394; 716/19; 382/144
See application file for complete search history.

(56) References Cited

U.S. PATENT DOCUMENTS 6,249,597 B1* 6/2001 Tsudaka .................... 382/144
6,536,032 B1* 3/2003 Tanaka et al. ............... 716/21
6,586,146 B1 7/2003 Chang et al.
6,811,953 B1* 11/2004 Hatada et al. .............. 430/311

FOREIGN PATENT DOCUMENTS

JP        6-196378    7/1994
JP        3152776     1/2001

* cited by examiner

*Primary Examiner*—S. Rosasco
(74) *Attorney, Agent, or Firm*—Finnegan, Henderson, Farabow, Garrett & Dunner, L.L.P.

(57) ABSTRACT

An exposure method is disclosed, which comprises preparing a first mask in which a size of a mask pattern is measured in advance, calculating a first exposure quantity to be applied to the first mask to provide a first resist pattern by using the first mask, simulating optical intensity distributions on a wafer in a case where the first mask is used and an optical intensity distribution on the wafer in a case where a second mask is used, a size of a mask pattern of the second mask being measured in advance, calculating a difference in optical intensity between the first mask and the second mask from the simulated optical intensity distributions, and calculating a second exposure quantity to be applied to the second mask to provide a second resist pattern, from the first exposure quantity and the difference in optical intensity.

13 Claims, 4 Drawing Sheets

EXPOSURE METHOD, EXPOSURE QUANTITY CALCULATING SYSTEM USING THE EXPOSURE METHOD AND SEMICONDUCTOR DEVICE MANUFACTURING METHOD USING THE EXPOSURE METHOD

CROSS-REFERENCE TO RELATED APPLICATIONS

This application is based upon and claims the benefit of priority from prior Japanese Patent Application No. 2003-101063, filed Apr. 4, 2003, the entire contents of which are incorporated herein by reference.

BACKGROUND OF THE INVENTION

1. Field of the Invention

The present invention relates to an exposure method in a lithography process, an exposure quantity calculating system and a manufacturing method of a semiconductor device.

2. Description of the Related Art

Recently, along with progress in size reduction technology of semiconductors, the sizes are reduced in each lithography process in the manufacture of semiconductor devices, and both size control at high precision and with low fluctuation are demanded at the same time. To satisfy the demand, it is necessary to determine the optimum exposure quantity and focus position in each mask and exposure device used in each lithography process, and this job is generally known as exposure conditioning.

During an exposure conditioning job, the manufacturing process must be stopped, and since it is a time-consuming job, it is desired to shorten the time as much as possible in consideration of production efficiency. To simplify this kind of exposure conditioning job, a method as shown in FIGS. 9 and 10 is known (for example, see Jpn. Pat. No. 3152776 (page 5, FIGS. 1 and 2)).

FIG. 9 is a block diagram of a configuration of an exposure calculating system, and FIG. 10 is a flowchart showing a method of calculating an exposure quantity.

The exposure calculating system disclosed in Jpn. Pat. No. 3152776 comprises, as shown in FIG. 9, mask size measuring unit 101 for measuring the pattern size of a mask for use in a lithography process, resist pattern size measuring unit 102 for measuring the size of a pattern formed on a resist film in the lithography process, an input unit 103 for inputting conditions about the lithography process and data about the processing lot, and a processing unit 104 for processing data sent from the mask size measuring unit 101, the resist pattern size measuring unit 102 and the input unit 103, storing the processed data in a storage 105, calculating the exposure quantity by using the data stored in the storage 105, and giving an instruction to an exposure device 106. The mask size measuring unit 101, the resist pattern size measuring unit 102, the input unit 103, and the storage 105 are connected to the processing unit 104, and the processing unit 104 is connected to the exposure device 106.

In a method of calculating an optimum exposure quantity, as shown in FIG. 10, first, an exposure curve is approximated as a straight line, a target resist pattern size is substituted by using the inclination of exposure curve (exposure correction coefficient) obtained from the exposure quantity and the exposure data accumulated, and a first exposure quantity is calculated (step S101). In succession, by using the inclination near the target resist pattern size (mask correction coefficient) in the exposure curve composed of the past exposure data, and the difference (size deviation) between the mask design size and the size of the mask to be used, a correction exposure quantity is calculated (step S102). Summing up the first exposure quantity calculated in step S101 and the correction exposure quantity calculated in step S102, a new exposure quantity is calculated (step S103).

Repeating these steps several times, the optimum exposure quantity for satisfying the target resist pattern size is calculated. Herein, data required for calculating the optimum exposure quantity include accumulated exposure data of a plurality of lots, an exposure data curve based on the exposure quantity versus resist pattern size, and the exposure correction coefficient, mask correction coefficient, size deviation, etc.

In the above-explained method of exposing a semiconductor device, between lots and between semiconductor wafers in semiconductor device manufacture, size control of high precision and with low fluctuation can be achieved. However, it requires sampling of the exposure data curve and calculating jobs of the exposure correction efficiency, mask correction efficiency, size deviation, etc. This conventional method further requires sampling of the exposure conditioning job several times. Therefore, it takes time and labor for calculating the optimum exposure condition.

BRIEF SUMMARY OF THE INVENTION

According to an aspect of the present invention, there is provided an exposure method comprising:

preparing a first mask in which a size of a mask pattern is measured in advance;

calculating a first exposure quantity to be applied to the first mask to provide a first resist pattern by using the first mask;

simulating optical intensity distributions on a wafer in a case where the first mask is used and an optical intensity distribution on the wafer in a case where a second mask is used, a size of a mask pattern of the second mask being measured in advance;

calculating a difference in optical intensity between the first mask and the second mask from the simulated optical intensity distributions; and calculating a second exposure quantity to be applied to the second mask to provide a second resist pattern, from the first exposure quantity and the difference in optical intensity.

According to another aspect of the present invention, there is provided an exposure method comprising:

preparing a first mask in which a size of a mask pattern is measured in advance;

calculating a first exposure quantity to be applied to the first mask to provide a first resist pattern by using the first mask;

calculating an exposure quantity difference from a mask pattern size difference of mask patterns between the first mask and a second mask by an optical simulation, a size of a mask pattern of the second mask being measured in advance;

calculating a ratio of the exposure quantity difference in the second mask with respect to the first exposure quantity to be applied to the first mask, from the exposure quantity difference; and calculating a second exposure quantity to be applied to the second mask to provide a second resist pattern, from the first exposure quantity and the ratio of the exposure quantity difference.

According to a further aspect of the present invention, there is provided an exposure method comprising:

preparing a first mask in which a size of a mask pattern is measured in advance;

calculating a first exposure quantity to be applied to the first mask to provide a first resist pattern by using the first mask and a first exposure device;

simulating an optical intensity distribution on a wafer in a case where the first mask is used and an optical intensity distribution on the wafer in a case where a second mask is used, a size of a mask pattern of the second mask being measured in advance;

calculating a difference in optical intensity between the first mask and the second mask from the simulated optical intensity distributions;

calculating a second exposure quantity to be applied to the second mask to provide a second resist pattern in a case where the first exposure device is used, from the first exposure quantity and the difference in optical intensity;

determining a third exposure quantity to be applied to the first mask to provide the first resist pattern in a case where the second exposure device is used, from exposure data accumulated, and calculating a difference between the third exposure quantity and the first exposure quantity; and calculating a fourth exposure quantity to be applied to the second mask to provide the second resist pattern in a case where the second exposure device is used, from the difference in exposure quantity and the difference in optical intensity.

According to a further aspect of the present invention, there is provided an exposure quantity calculating system comprising:

an exposure device;

exposure calculating unit connected to the exposure device, an input unit configured to input data, a mask pattern size measuring unit configured to measure a size of a mask pattern of a mask, a resist pattern size measuring unit configured to measure a size of a pattern formed on a resist film, and a storage configured to store data; and an optical intensity distribution simulating unit connected to the exposure condition calculating unit and incorporating an optical simulation tool, wherein a difference in optical intensity between a first mask to be first used and a second mask to be later used is calculated by the optical intensity distribution simulating unit, and an optimum exposure quantity to be applied to the second mask is calculated by the exposure condition calculating unit.

According to a further aspect of the present invention, there is provided an exposure quantity calculating system comprising:

an exposure device;

exposure condition calculating unit connected to the exposure device, an input unit configured to input data, a mask pattern size measuring unit configured to measure a size of a mask pattern of a mask, a resist pattern size measuring unit configured to measure a size of a pattern formed on a resist film, and a storage configured to store data; and an optical intensity distribution simulating unit connected to the exposure condition calculating unit and incorporating an optical simulation tool, wherein a ratio of exposure quantity difference based on a mask pattern size difference of mask patterns between a first mask to be first used and a second mask to be later used is calculated by the optical intensity distribution simulating unit, and an optimum exposure quantity to be applied to the second mask is calculated by the exposure condition calculating unit.

According to a further aspect of the present invention, there is provided a method of manufacturing a semiconductor device comprising:

preparing a first mask in which a size of a mask pattern is measured in advance;

calculating a first exposure quantity to be applied to the first mask to provide a first resist pattern by using the first mask;

simulating optical intensity distributions on a wafer in a case where the first mask is used and an optical intensity distribution on the semiconductor wafer in a case where a second mask is used, a size of a mask pattern of the second mask being measured in advance;

calculating a difference in optical intensity between the first mask and the second mask from the simulated optical intensity distributions;

calculating a second exposure quantity to be applied to the second mask to provide a second resist pattern, from the first exposure quantity and the difference in optical intensity;

exposing a semiconductor wafer to light with the calculated second exposure quantity via the second mask to form the second resist pattern in a resist film formed on the semiconductor wafer and etching unnecessary portions of the resist film; and forming a patterned layer on the semiconductor wafer by using the second resist pattern as a mask.

According to a further aspect of the present invention, there is provided a method of manufacturing a semiconductor device comprising:

preparing a first mask in which a size of a mask pattern is measured in advance;

calculating a first exposure quantity to be applied to the first mask to provide a first resist pattern by using the first mask;

exposing a semiconductor wafer to light with the calculated first exposure quantity via the first mask to form the first resist pattern in a resist film formed on the semiconductor wafer and etching unnecessary portions of the resist film;

forming a patterned layer on the semiconductor wafer by using the first resist pattern as a mask;

calculating an exposure quantity difference from a mask pattern size difference of mask patterns between the first mask and a second mask by an optical simulation, a size of a mask pattern of the second mask being measured in advance;

calculating a ratio of the exposure quantity difference in the second mask with respect to the first exposure quantity to be applied to the first mask, from the exposure quantity difference; and calculating a second exposure quantity to be applied to the second mask to provide a second resist pattern, from the first exposure quantity and the ratio of the exposure quantity difference; and exposing the semiconductor wafer to light with the calculated second exposure quantity via the second mask to form the second resist pattern in a resist film formed on the semiconductor wafer and etching unnecessary portions of the resist film; and forming a patterned layer on the semiconductor wafer by using the second resist pattern as a mask.

According to a further aspect of the present invention, there is provided a method of manufacturing a semiconductor device comprising:

preparing a first mask in which a size of a mask pattern is measured in advance;

calculating a first exposure quantity to be applied to the first mask to provide a first resist pattern by using the first mask and a first exposure device;

simulating an optical intensity distribution on a wafer in a case where the first mask is used and an optical intensity distribution on the wafer in a case where a second mask is used, a size of a mask pattern of the second mask being measured in advance;

calculating a difference in optical intensity between the first mask and the second mask from the simulated optical intensity distributions;

calculating a second exposure quantity to be applied to the second mask to provide a second resist pattern in a case where the first exposure device is used, from the first exposure quantity and the difference in optical intensity;

determining a third exposure quantity to be applied to the first mask to provide the first resist pattern in a case where the second exposure device is used, from exposure data accumulated, and calculating a difference between the third exposure quantity and the first exposure quantity;

calculating a fourth exposure quantity to be applied to the second mask to provide the second resist pattern in a case where the second exposure device is used, from the difference in exposure quantity and the difference in optical intensity;

exposing a semiconductor wafer to light with the calculated fourth exposure quantity by using the second exposure device via the second mask to form the second resist pattern in a resist film formed on the semiconductor wafer and etching unnecessary portions of the resist film; and forming a patterned layer on the semiconductor wafer by using the second resist pattern as a mask.

DETAILED DESCRIPTION OF THE INVENTION

Embodiments of the present invention will be described, referring to the accompanying drawings.

(First Embodiment)

Figure 1:
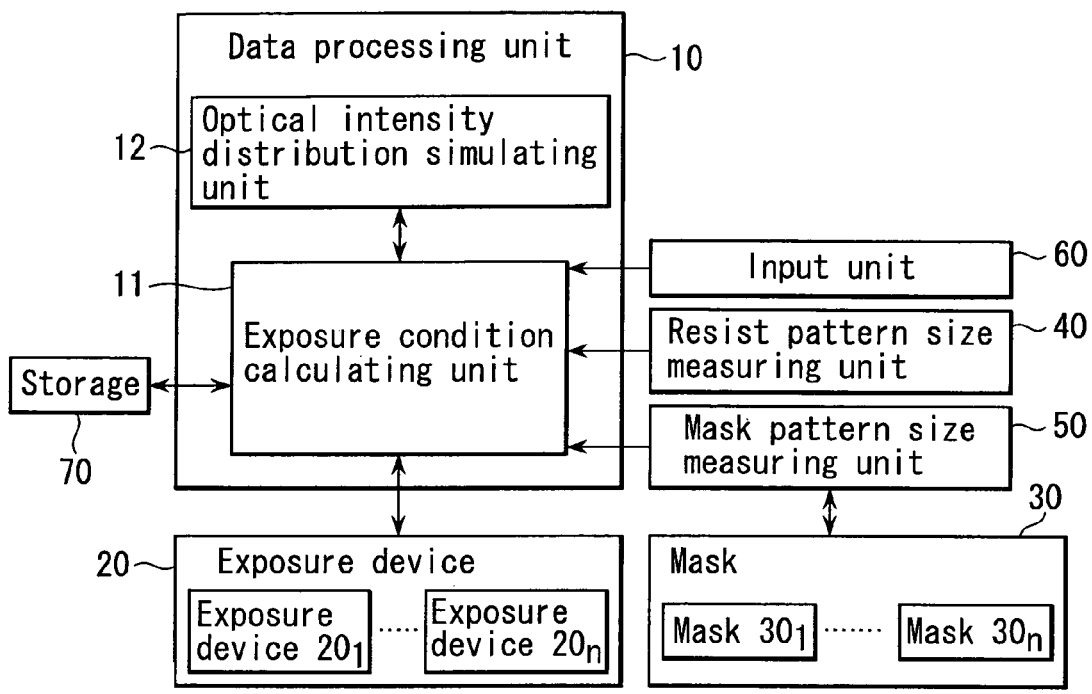
FIG. 1 is a block diagram of a configuration of an exposure quantity calculating system according to a first embodiment of the present invention.
Figure 2:
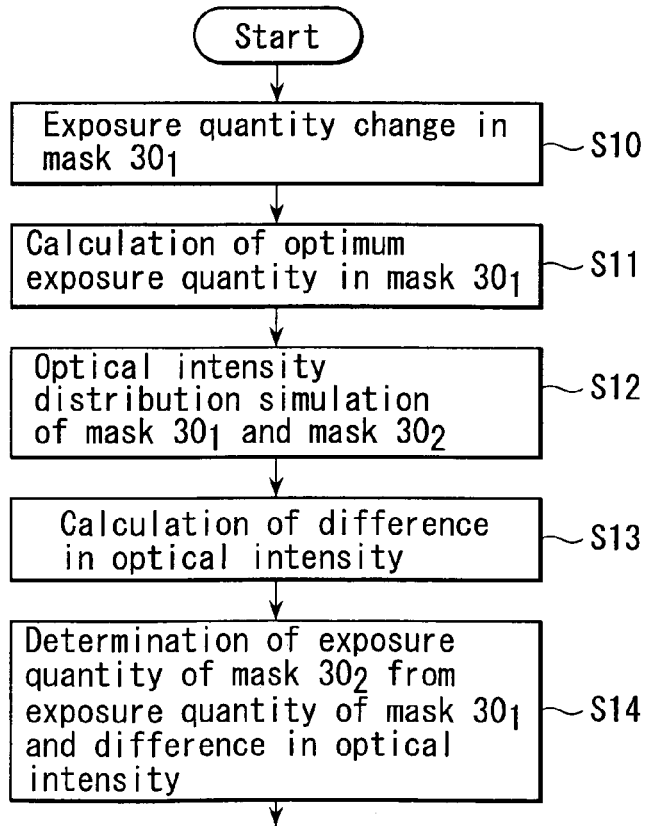
FIG. 2 is a flowchart showing a method of exposing a semiconductor device according to the first embodiment of the present invention.
Figure 3:
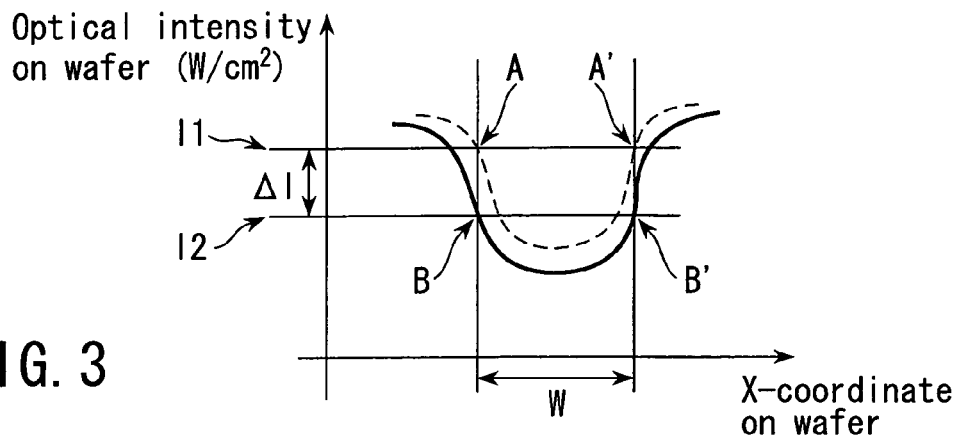
FIG. 3 is an explanatory diagram for determining a difference in exposure quantity between masks from simulation of optical intensity distribution according to the first embodiment of the present invention.

A method of exposing a semiconductor device according to a first embodiment of the invention will be described while referring to FIGS. 1 to 3. FIG. 1 is a block diagram of a configuration of an exposure quantity calculating system, FIG. 2 is a flowchart showing a method of exposing a semiconductor device, and FIG. 3 is an explanatory diagram for determining a difference in exposure quantity between masks from simulation of optical intensity distribution.

As shown in FIG. 1, the exposure quantity calculating system comprises a data processing unit 10 including an exposure condition calculating unit 11 and optical intensity distribution simulating unit 12, resist pattern size measuring unit 40, mask size measuring unit 50, an input unit 60, and a storage 70. The optical intensity distribution simulating unit 12, the resist pattern size measuring unit 40, the mask size measuring unit 50, the input unit 60, and a storage 70 are connected to the exposure condition calculating unit 11.

The exposure condition calculating unit 11 is also connected to an exposure device 20, and the mask size measuring unit 50 is also connected to a mask 30.

The exposure condition calculating unit 11 processes data sent from the optical intensity distribution simulating unit 12, the resist pattern size measuring unit 40, the mask size measuring unit 50, and the input unit 60, stores the processed data in the storage 70, and further calculates the exposure quantity by using the data stored in the storage 70 and gives instructions to the exposure device 20.

The optical intensity distribution simulating unit 12 incorporates an optical intensity distribution simulator tool capable of calculating optical intensity (high-speed digital operation) to satisfy the exposure condition and exposure shape by a fast Fourier transform (hereinafter, referred to as FFT) algorithm.

The exposure device 20 is composed of a plurality of exposure devices $20_1$, $20_2$, $20_3$, . . . , and the mask 30 is composed of a plurality of masks $30_1$, $30_2$, $30_3$, . . . . Each of the exposure devices $20_1$, $20_2$, $20_3$, . . . is generally referred to as an exposure device 20 for simplicity. Similarly, each of the masks $30_1$, $30_2$, $30_3$, . . . is referred to as a mask 30 for simplicity. The resist pattern size measuring unit 40 measures the size of a pattern formed on a resist film in the lithography process. The resist pattern is a line and space (L/S) pattern, for example. The mask size measuring unit 50 measures the size of a mask pattern of the mask 30 for use in the lithography process. The mask 30 is a quadruple reticle mask, for example, and the mask pattern of the reticle mask is a line and space (L/S) pattern, for example.

The input unit 60 is an input unit for inputting data such as conditions about the lithography process, data about the mask 30 to be used and processing lot, and data of parameters for simulation.

The storage 70 stores data of parameters necessary for optical simulation, for example, related data about the exposure device such as numerical aperture (NA), coherence (σ), light wavelength (λ), defocus, exposure (E), exposure intensity (I), and reduction factor; resist related data such as type of resist, refractive index (N) before and after exposure corresponding to the resist, and resist thickness; developing conditions such as temperature of a developing solution, pH, developing time, and developing speed; baking conditions such as temperature and time; and mask related data such as sizes of L/S of a reticle mask, and these data are inputted from the input unit 60 and stored preliminarily.

This is to explain the method of exposing a semiconductor device using the exposure quantity calculating system having such a configuration. An excimer exposure device having light source wavelength of 248 nm (KrF), numerical aperture of 0.68, and reduction factor of ¼ is used. The pattern of the mask 30 (reticle mask) to be used is an L/S pattern, the size of the L/S pattern of the mask 30 is close to the target of 600 nm, and the target size of the finished resist pattern, i.e., the target size of the L/S resist pattern in this embodiment, is 125 nm. The size of 125 nm of L/S resist pattern is a typical size in the lithography process carried out in manufacturing a semiconductor device. Here, the size of the mask pattern of the mask 30 denotes a width of the light shielding band area in the mask 30, and is preliminarily measured by the mask size measuring device 50, and this data is stored in the storage 70.

Process conditions other than exposure conditions, for example, film thickness of chemically amplifying type positive resist, prebake temperature and time, development temperature and time using an alkaline aqueous solution, and postbake temperature and time are executed under the same conditions.

Referring to the exposure method, first, the optimum exposure quantity satisfying a target resist pattern size (light shielding band width 125 nm) is calculated in the case of using a first mask $30_1$ the pattern size (i.e., light shielding band area width) of which is measured in advance by the mask size measuring unit 50. Here, the mask pattern size is 605 nm, while the design value is 600 nm.

To calculate the exposure quantity, as shown in FIG. 2, an approximate value of the exposure quantity is determined from the exposure data stored in the storage 70 by the exposure condition calculating unit 11, and then the exposure quantity is increased and decreased from the approximate value (step S10). For example, from the center value of the exposure quantity of 13.5 mJ, the exposure quantity is changed in five conditions by 0.5 mJ on both sides (a total of 11 conditions).

After development and postbake, the resist pattern size is measured by the resist pattern size measuring unit 40, and the measured data is inputted to the input unit 60, and the exposure curve (not straight line) of the resist pattern size to the exposure quantity is calculated in the exposure condition calculating unit 11. Using this exposure curve, the optimum exposure quantity satisfying the target resist pattern size (space width i.e. light shielding band width, 125 nm) is calculated. The optimum exposure quantity (first exposure quantity) satisfying the target resist pattern size in the case of using the first mask $30_1$ is E1=14.0 mJ (step S11).

When the mask 30 is changed to a second mask $30_2$, the method of calculating an optimum exposure quantity will be explained. Herein, the size of the preliminarily measured second mask $30_2$ is 592 nm, smaller by 13 nm than the size (605 nm) of the first mask $30_1$, so that by the same exposure quantity (E1=14.0 mJ), a resist pattern size thus formed becomes smaller than the target resist pattern size (space width 125 nm).

Then, the exposure condition calculating unit 11 reads out data of parameters necessary for optical simulation stored preliminarily in the storage 70, and this data is transmitted to the optical intensity distribution simulating unit 12, so that the optical intensity distribution simulating unit 12 simulates the optical intensity distribution for the purpose of calculating the optimum exposure quantity. In the simulation of optical intensity distribution, the optical intensity to the first mask $30_1$ and the second masks $30_2$ is changed. A simulator tool is used for calculating the optical intensity satisfying the exposure condition and the exposure shape by the algorithm based on the Fast Fourier Transform (step S12).

It is seen in FIG. 3 showing the optical intensity distribution curve calculated by the optical intensity distribution simulating unit 12 based on instruction from the exposure condition calculating unit 11, that the optical intensity $I_1$ satisfying the target resist pattern size W (125 nm) in the case of using the first mask $30_1$ is at points A, A', and the optical intensity $I_2$ satisfying the target resist pattern size W (125 nm) in the case of using the second mask $30_2$ is at points B, B'. The difference of the optical intensities for the same size W, which is between the first mask $30_1$ the second mask $30_2$, is $\Delta I$ (step S13).

In FIG. 3, the solid line is the optical intensity distribution curve on a wafer in the case of using the second mask $30_2$, and the broken line shows the optical intensity distribution curve on the wafer in the case of using the first mask $30_1$. As the optical intensity increases, the resist pattern size (W) on the wafer increases, or as the optical intensity decreases, the resist pattern size (W) on the wafer decreases.

By the optical intensity distribution curve, the exposure quantity (second exposure quantity) $E_2$ of the second mask $30_2$ is determined as follows:

$$E_2 = (1 - \Delta I/I_1) \times E_1 \quad (1)$$

The exposure quantity E (J/cm$^2$) is the product of optical intensity I (W/cm$^2$) and time T (sec).

Substituting the numerical value obtained in the above process into formula (1), $\Delta I/I_1 = 0.0596$ is calculated, and the second exposure quantity ($E_2=13.16$ mJ) satisfying the target resist pattern size in the case of using the second mask $30_2$ is calculated (step S14).

In the method of exposing a semiconductor device in the present first embodiment, by employing the optical intensity distribution simulation capable of calculating the exposure quantity in the case of using the first mask $30_1$ for realizing the target resist pattern size width, the size of the mask pattern of the first mask $30_1$, the size of the mask pattern of the second mask $30_2$, and the optical intensity distribution on the wafer, the optimum exposure quantity for realizing the target resist width necessary for the second mask $30_2$ can be calculated.

Therefore, even if the mask 30 to be used is changed, it is not required to repeat the step of calculating the exposure quantity several times, and it is not required to calculate the exposure correction coefficient and mask correction coefficient obtained from the exposure data curve on the basis of the accumulated exposure data and exposure quantity versus resist pattern size of a plenty of lots. Accordingly, the through-put in the lithography process important in the process of manufacturing a semiconductor device can be enhanced more than in the prior art.

Figure 7:
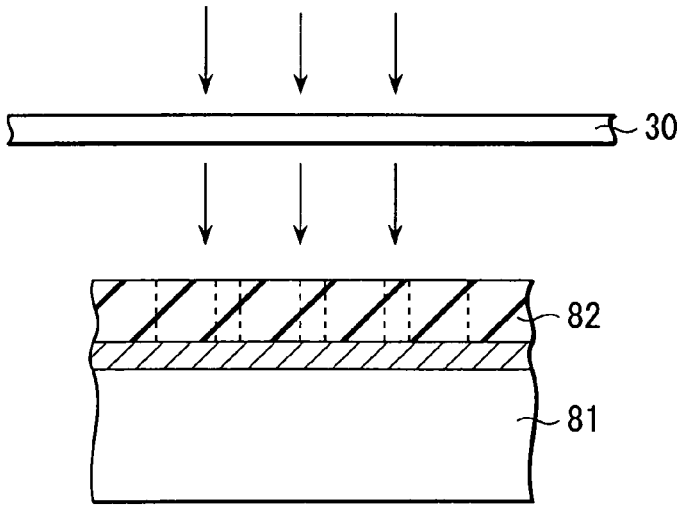
FIG. 7 is a cross sectional view for explaining a step of a manufacturing method of a semiconductor device.
Figure 8:
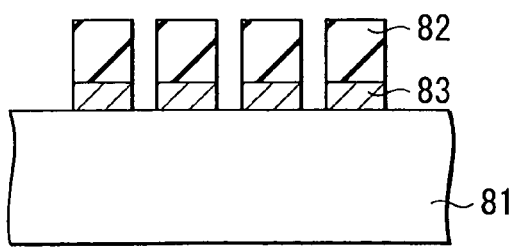
FIG. 8 is a cross sectional view for explaining a step of the manufacturing method of the semiconductor device.
Figure 9:
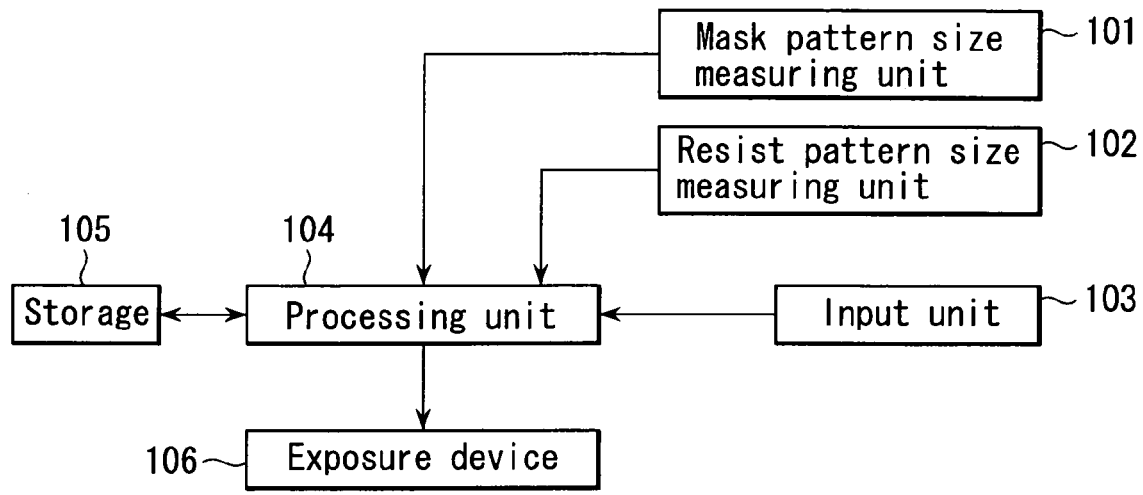
FIG. 9 is a block diagram of a configuration of a conventional exposure quantity calculating system.
Figure 10:
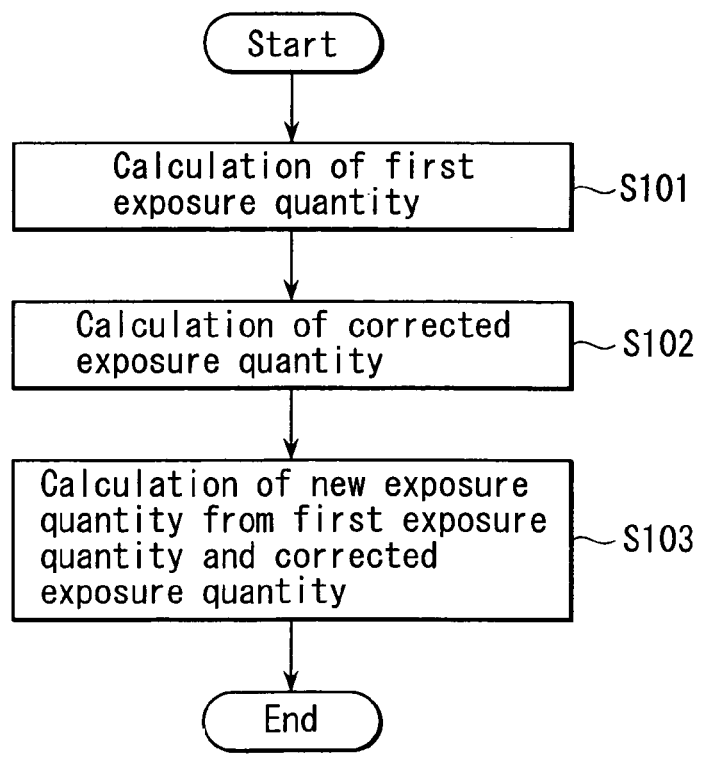
FIG. 10 is s flowchart showing conventional exposure quantity calculation.

In a manufacturing method of a semiconductor device using the exposing method of the present embodiment, following calculating the exposure quantity ($E_2=13.16$ mJ) satisfying the target resist pattern size in the case of using the second mask $30_2$ (step S14), a semiconductor wafer 81 is exposed to light with the calculated second exposure quantity via the second mask $30_2$ to form the second resist pattern in a resist film 82 formed on the semiconductor wafer 81, as shown in FIG. 7. After that, the unnecessary portions of the resist film are removed, and by using the second resist pattern as a mask, a patterned layer 83 is formed on the semiconductor wafer 81, as shown in FIG. 8.

(Second Embodiment)

Figure 4:
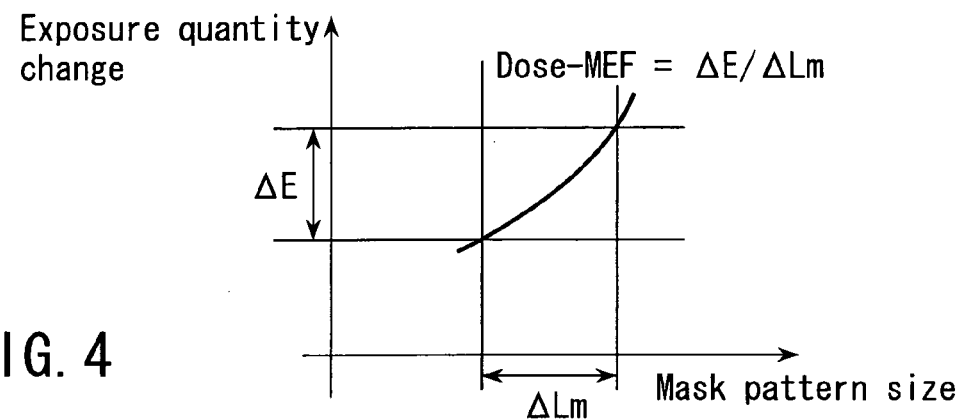
FIG. 4 is an explanatory diagram of a Dose-MEF curve according to a second embodiment of the present invention.
Figure 5:
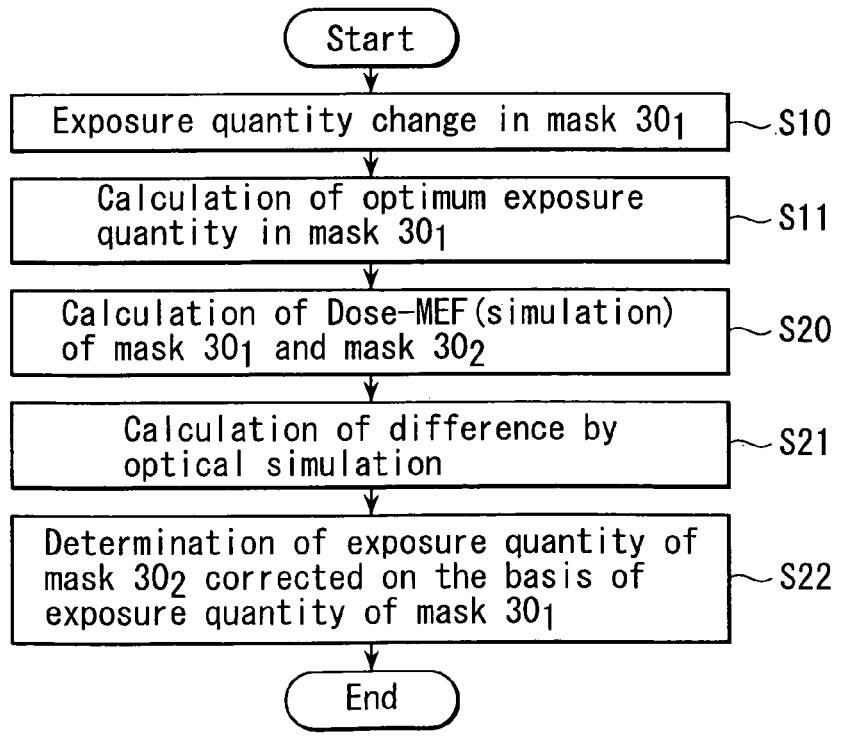
FIG. 5 is a flowchart showing a method of exposing a semiconductor device according to the second embodiment of the present invention.

A method of exposing a semiconductor device according to a second embodiment of the invention will be described below by referring to FIGS. 4 and 5. FIG. 4 is an explanatory diagram of a Dose-MEF curve, and FIG. 5 is a flowchart showing a method of exposing a semiconductor device. This embodiment is similar to the first embodiment except for the optical simulation technique and a method of correcting an exposure quantity, and the other configuration and process sequence are the same, and only the different points are explained below.

The MEF (mask critical dimension enhancement factor) is as shown in FIG. 4, in which when exposing and transferring by a certain quantity, the resist pattern size on the wafer transferred in the case where the mask size change of $\Delta Lm$ varies by $\Delta Lr$, and the ratio of the two is not 1. Hence, the value of $\Delta Lr/\Delta Lm$ is defined as MEF.

Hence, when it is intended to finish the resist pattern on the wafer to be the target resist pattern size, if the mask size changes by $\Delta Lm$, the exposure quantity must be changed by $\Delta E$. Supposing the exposure quantity of the mask 30 when $\Delta Lm=0$ to be E and the variation of the exposure quantity to be $\Delta D=\Delta E/E$, $\Delta D$ is a dimensionless value. From the similarity to the MEF, the value of $\Delta D/\Delta Lm$ is defined, and it is specified as Dose-MEF. In FIG. 4, the abscissa denotes the mask size, and the ordinate is the exposure quantity change.

As shown in FIG. 5, in the flowchart showing the method of exposing a semiconductor device in the second embodiment, step S10 and step S11 are first carried out. These steps S10 and S11 are the same as those in FIG. 2, and explanation thereof is omitted.

The method of calculating the optimum exposure quantity in the case where the mask 30 is changed, will be explained below. Here, the size of the mask pattern of the second mask $30_2$ is 592 nm, smaller by 13 nm from the size (605 nm) of the first mask $30_1$, and thus if the same exposure quantity (E1=14.0 mJ) as that applied to the first mask $30_1$ is applied to the second mask $30_2$, the size of a resist film thus formed becomes smaller than the target resist pattern size (space width 125 nm).

If the mask size deviates from the reference value, by correcting the exposure quantity by this portion of Dose-MEF, the resist can be formed in the same size even if the mask 30 is changed. The Dose-MEF can be determined from optical simulation.

For the purpose of calculating the optimum exposure quantity, this dose-MEF is determined from optical simulation. More specifically, the exposure condition calculating unit 11 reads out data of parameters necessary for optical stimulation from the storage 70, the data being stored beforehand, and sends the data to the optical intensity distribution simulating unit 12, and the optical intensity distribution simulating unit 12 calculates the exposure quantity variation ($\Delta D$) of the size difference ($\Delta Lm$) between the size of the mask pattern of the first mask $30_1$ and the size of the mask pattern of the second mask $30_2$. The exposure condition calculating unit 11 calculates the exposure quantity variation ($\Delta D$) corresponding to the size difference ($\Delta Lm$), that is, the Dose-MEF value (step S20).

The calculated Dose-MEF value is 0.46 (%/nm). It means, when the mask pattern size varies by 1 nm on the mask 30, that the optimum exposure utilization on the wafer fluctuates by 0.46%. The Dose-MEF can also be calculated by experiment.

In succession, the difference of exposure quantity change ($\Delta E$) is calculated from the Dose-MEF calculated from optical simulation (step S21). Specifically, it is determined from the formula of exposure quantity variation $\Delta E$ when the mask pattern size is changed by $\Delta Lm$.

$$E = \Delta Lm \times Dose\text{-}MEF \qquad (2)$$

In this case, the formula (2) can be determined by multiplying the sum 13 nm of the size difference 5 nm of the first mask $30_1$ and size difference 8 nm of the second mask $30_2$ by 0.46. That is, it is sufficient that the exposure quantity is decreased by 5.98%, or the amount of exposure quantity change $\Delta E$.

The next step is to calculate the second exposure quantity ($E_2=13.16$ mJ) for satisfying the target resist pattern size (space width) of 125 nm by the second mask $30_2$ (step S22).

Here, if the value of Dose-MEF differs depending on the variation of the mask size from the reference size, the values of Dose-MEF in the first mask $30_1$ and second mask $30_2$ are calculated from optical simulation. Using these values, the second exposure quantity $E_2$ satisfying the target resist pattern size (space width) of 125 nm in the case of using the second mask $30_2$ is calculated.

In the method of exposing a semiconductor device according to the present second embodiment, by employing the optical simulation capable of calculating the exposure quantity in the first mask $30_1$ for realizing the target resist pattern size, the pattern size of the first mask $30_1$, the pattern size of the second mask $30_2$, and exposure quantity change to the first mask $30_1$ and the second mask $30_2$, the exposure quantity ideal for realizing the target resist pattern size necessary for the second mask $30_2$ can be calculated.

Therefore, even if the mask 30 to be used is changed, it is not necessary to repeat the step of calculating the exposure quantity several times, and it is not required to calculate the exposure correction coefficient or mask correction coefficient on the basis of the exposure data curve of the accumulated exposure data and exposure quantity versus resist pattern size from a plurality of lots. Accordingly, the through-put in the lithography process important in the process of manufacturing a semiconductor device can be enhanced as in the first embodiment.

In a manufacturing method of a semiconductor device using the exposing method of the present embodiment, following calculating the exposure quantity ($E_2=13.16$ mJ) satisfying the target resist pattern size in the case of using the second mask $30_2$ (step S22), a semiconductor wafer 81 is exposed to light with the calculated second exposure quantity via the second mask $30_2$ to form the second resist pattern in a resist film 82 formed on the semiconductor wafer 81, as shown in FIG. 7. After that, the unnecessary portions of the resist film are removed, and by using the second resist pattern as a mask, a patterned layer 83 is formed on the semiconductor wafer 81, as shown in FIG. 8.

(Third Embodiment)

Figure 6:
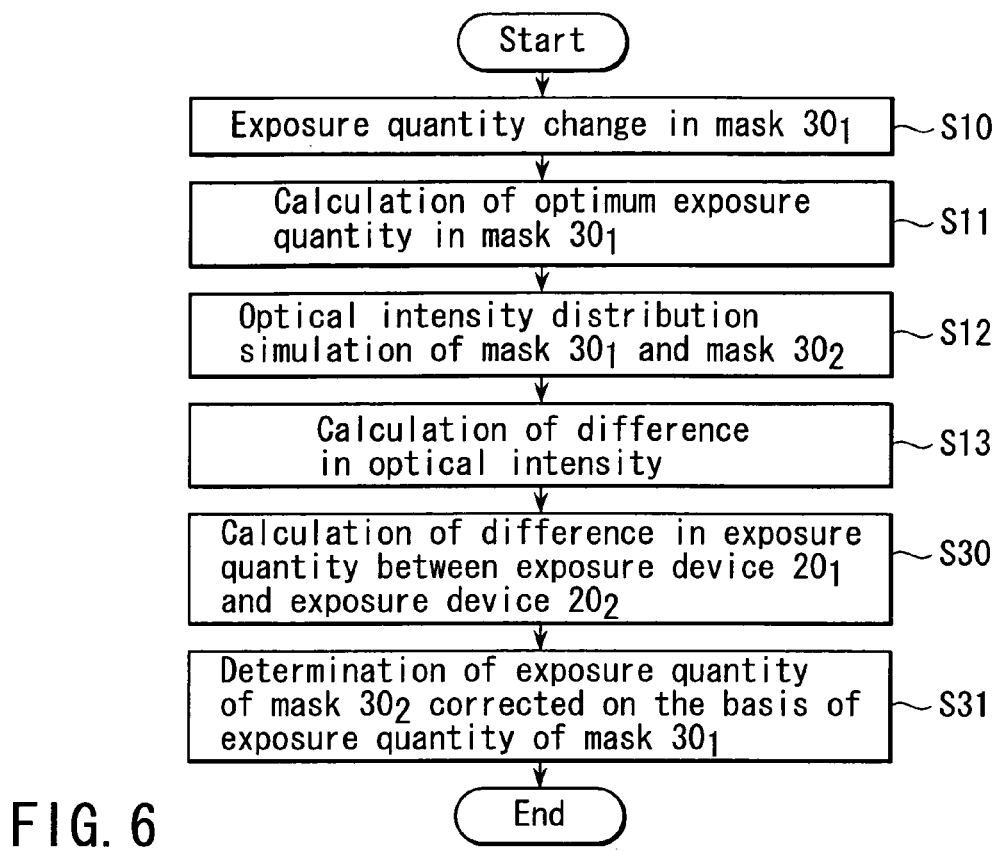
FIG. 6 is a flowchart showing a method of exposing a semiconductor device according to a third embodiment of the present invention.

A method of exposing a semiconductor device according to a third embodiment of the present invention will be described below by referring to FIG. 6. FIG. 6 is a flowchart showing a method of exposing a semiconductor device. This embodiment comprises two exposure devices, and hence the exposure quantity is changed by the differential portion of the exposure devices, and the others are same as in the first embodiment in configuration and process sequence, and only the different points are explained.

Generally, when exposure devices 20 are changed, the exposure quantity setting is not calibrated between devices, and the exposure quantity must be changed. When not only the masks 30 are changed, but also the exposure devices 20 are changed, it is necessary to set the exposure quantity individually in the exposure device 20$_1$ (first exposure device) and exposure device 20$_2$ (second exposure device).

As shown in FIG. 6, in the flowchart of the method of exposing a semiconductor device, first, the process from step S10 to step S13 is executed. This process is the same as in FIG. 2 and explanation is omitted.

Next, the difference in exposure quantity between the first exposure device 20$_1$ and the second exposure device 20$_2$ is calculated. That is, it is intended to calculate the exposure quantity change $\Delta E_m$ due to an exposure device difference between an exposure quantity $E_{11}$ in the case of using the first mask 30$_1$ and the second exposure device 20$_2$ and a first exposure quantity $E_1$ in the case of using the first mask 30$_1$ and the first exposure device 20$_1$.

Here, this exposure quantity $E_{11}$ is calculated from exposure information data of a plenty of lots accumulated hitherto in the case of using the second exposure device 20$_2$ and the first mask 30$_1$, and the exposure quantity change $\Delta E_m$ is calculated. The obtained exposure quantity change $\Delta E_m$ is 5% of the first exposure quantity $E_1$ of the first mask 30$_1$ (step S30).

In the case of using the second mask 30$_2$ and the second exposure device 20$_2$, the exposure quantity $E_{m2}$ to satisfy the target resist pattern size (space width 125 nm) is determined as $$E_{m2}=(1-\Delta I/I_1)\times(1-\Delta E_m/E_1)E_1 \quad (3)$$

In succession, by substituting the numerical value obtained in the above process into formula (3), the optimum exposure quantity $E_{m2}$=12.5 mJ to satisfy the target resist pattern size (space width 125 nm) in the case of using the second mask 30$_2$ and the second exposure device 20$_2$ can be calculated (step S31).

In the method of exposing a semiconductor device of the present third embodiment, even if the mask to be used and the exposure device are both changed, by using the first exposure quantity in the case of using the first exposure device 20$_1$ and the mask 30 for realizing the target resist pattern size, the size of the mask pattern of the first mask 30$_1$, the size of the mask pattern of the second mask 30$_2$, the exposure quantity change $\Delta E_m$ of the first exposure device 20$_1$ and the second exposure device 20$_2$ in the first mask 30$_1$, and the optical simulation, the optical exposure quantity for realizing the target resist pattern size width necessary when using the second exposure device 20$_2$ and third mask 30 can be calculated.

Therefore, even if the exposure device 20 and mask 30 are changed, it is not required to repeat the step of calculating the exposure quantity multiple times, and it is not required to calculate the exposure correction coefficient and mask correction coefficient from the exposure data curve based on the accumulated exposure data and exposure quantity versus resist pattern size in a plurality of lots. Accordingly, the through-put of the lithography process important in the process of manufacturing a semiconductor device can be enhanced as in the first embodiment.

In a manufacturing method of a semiconductor device using the exposing method of the present embodiment, following calculating the exposure quantity ($E_{m2}$=12.5 mJ) to satisfy the target resist pattern size (space width 125 nm) in the case of using the second mask 30$_2$ and the second exposure device 20$_2$ can be calculated (step S31), a semiconductor wafer 81 is exposed to light with the calculated second exposure quantity via the second mask 30$_2$ to form the second resist pattern in a resist film 82 formed on the semiconductor wafer 81, as shown in FIG. 7. After that, the unnecessary portions of the resist film are removed, and by using the second resist pattern as a mask, a patterned layer 83 is formed on the semiconductor wafer 81, as shown in FIG. 8.

In addition, the foregoing embodiments relate to the exposure method in the semiconductor device manufacturing process, however, the other embodiments applied to, for example, a general exposure method using photo resist may also be provided.

According to the embodiments of the present invention, an exposure method capable of realizing size control at high precision and with low fluctuations, by a small number of exposure conditioning jobs, and an exposure calculating system using the same are provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method comprising:
preparing a first mask in which a size of a mask pattern is measured in advance;
applying exposures on the first mask to form resist patterns;
obtaining an exposure curve of sizes of the formed resist patterns to quantities of the applied exposures;
calculating a first exposure quantity to be applied to the first mask from the exposure curve to provide a first resist pattern;
simulating an optical intensity distribution on a wafer in a case where the first mask is used and an optical intensity distribution on the wafer in a case where a second mask is used, a size of a mask pattern of the second mask being measured in advance;
calculating a difference in optical intensity between the first mask and the second mask from the simulated optical intensity distributions; and
calculating a second exposure quantity to be applied to the second mask to provide a second resist pattern, from the first exposure quantity and the difference in optical intensity.

2. The exposure method according to claim 1, wherein the mask pattern of each of the first mask and the second mask is a line-and-space pattern.

3. An exposure method comprising:
preparing a first mask in which a size of a mask pattern is measured in advance;
applying exposures on the first mask to form resist patterns;
obtaining an exposure curve of sizes of the formed resist patterns to quantities of the applied exposures;
calculating a first exposure quantity to be applied to the first mask from the exposure curve to provide a first resist pattern;
calculating an exposure quantity difference from a mask pattern size difference of mask patterns between the first mask and a second mask by an optical simulation, a size of a mask pattern of the second mask being measured in advance;
calculating a percentage of the exposure quantity difference in the second mask with respect to the first exposure quantity to be applied to the first mask, from the exposure quantity difference; and calculating a second exposure quantity to be applied to the second mask to provide a second resist pattern, from the first exposure quantity and the percentage of the exposure quantity difference.

4. The exposure method according to claim 3, wherein the mask pattern of each of the first mask and the second mask is a line-and-space pattern.

5. An exposure method comprising:
preparing a first mask in which a size of a mask pattern is measured in advance;
applying exposures on the first mask to form resist patterns by using a first exposure device;
obtaining an exposure curve of sizes of the formed resist patterns to quantities of the applied exposures;
calculating a first exposure quantity to be applied to the first mask from the exposure curve to provide a first resist pattern;
simulating an optical intensity distribution on a wafer in a case where the first mask is used and an optical intensity distribution on the wafer in a case where a second mask is used, a size of a mask pattern of the second mask being measured in advance;
calculating a difference in optical intensity between the first mask and the second mask from the simulated optical intensity distributions;
calculating a second exposure quantity to be applied to the second mask to provide a second resist pattern in a case where the first exposure device is used, from the first exposure quantity and the difference in optical intensity;
determining a third exposure quantity to be applied to the first mask to provide the first resist pattern in a case where a second exposure device is used, from exposure data accumulated, and calculating a difference between the third exposure quantity and the first exposure quantity; and
calculating a fourth exposure quantity to be applied to the second mask to provide the second resist pattern in a case where the second exposure device is used, from the difference in exposure quantity and the difference in optical intensity.

6. The exposure method according to claim 5, wherein the mask pattern of each of the first mask and the second mask is a line-and-space pattern.

7. The exposure method according to claim 5, wherein each of the first exposure device and the second exposure device is an excimer laser exposure device.

8. An exposure quantity calculating system comprising:
an exposure device;
exposure calculating unit connected to the exposure device, an input unit configured to input data, a mask pattern size measuring unit configured to measure a size of a mask pattern of a mask, a resist pattern size measuring unit configured to measure a size of a pattern formed on a resist film, and a storage configured to store data; and
an optical intensity distribution simulating unit connected to the exposure condition calculating unit and incorporating an optical simulation tool,
wherein exposures are applied on a first mask having a mask pattern to form resist patterns by the exposure device;
an exposure curve of sizes of the formed resist patterns to quantities of the applied exposures is calculated by the exposure calculating unit;

an optimum exposure quantity to be applied to the first mask is calculated from the exposure curve to provide a first resist pattern corresponding to the mask pattern of the first mask;
an optical intensity distribution on a wafer in a case where the first mask is first used and an optical intensity distribution on the wafer in a case where a second mask having a mask pattern is later used, are simulated;
a difference in optical intensity between the first mask and the second mask is calculated from the simulated optical intensity distributions by the optical intensity distribution simulating unit, and
an optimum exposure quantity to be applied to the second mask is calculated from the optimum exposure quantity to be applied to the first mask and the difference in optical intensity by the exposure condition calculating unit to provide a second resist pattern corresponding to the mask pattern of the second mask.

9. The exposure quantity calculating system according to claim 8, wherein the exposure device is an excimer laser exposure device.

10. The exposure quantity calculating system according to claim 8, wherein the mask pattern of the mask is a line-and-space pattern.

11. An exposure quantity calculating system comprising:
an exposure device;
exposure calculating unit connected to the exposure device, an input unit configured to input data, a mask pattern size measuring unit configured to measure a size of a mask pattern of a mask, a resist pattern size measuring unit configured to measure a size of a pattern formed on a resist film, and a storage configured to store data; and
an optical intensity distribution simulating unit connected to the exposure condition calculating unit and incorporating an optical simulation tool,
wherein exposures are applied on a first mask having a mask pattern to form resist patterns by the exposure device;
an exposure curve of sizes of the formed resist patterns to quantities of the applied exposures is calculated by the exposure calculating unit;
an optimum exposure quantity to be applied to the first mask is calculated from the exposure curve to provide a first resist pattern corresponding to the mask pattern of the first mask;
an exposure quantity difference is calculated from a mask pattern size difference of mask patterns between the first mask and a second mask having a mask pattern by an optical simulation;
a percentage of the exposure quantity difference based on the mask pattern size difference between the first mask and the second mask is calculated from the exposure quantity difference by the optical intensity distribution simulating unit, and
an optimum exposure quantity to be applied to the second mask is calculated from the optimum exposure quantity to be applied to the first mask and the percentage of the exposure quantity difference by the exposure condition calculating unit to provide a second resist pattern corresponding to the mask pattern of the second mask.

12. The exposure quantity calculating system according to claim 11, wherein the exposure device is an excimer laser exposure device.

13. The exposure quantity calculating system according to claim 11, wherein the mask pattern of the mask.

* * * * *